(12) United States Patent
Yoshida et al.

(10) Patent No.: US 11,063,375 B2
(45) Date of Patent: Jul. 13, 2021

(54) CONNECTION INSTRUMENT

(71) Applicant: ZEON CORPORATION, Tokyo (JP)

(72) Inventors: Masayoshi Yoshida, Tokyo (JP);
Midori Yamaai, Tokyo (JP); Naomi Shiga, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 16/766,747

(22) PCT Filed: Nov. 6, 2018

(86) PCT No.: PCT/JP2018/041212
§ 371 (c)(1),
(2) Date: May 26, 2020

(87) PCT Pub. No.: WO2019/111622
PCT Pub. Date: Jun. 13, 2019

(65) Prior Publication Data
US 2020/0373686 A1 Nov. 26, 2020

(30) Foreign Application Priority Data
Dec. 6, 2017 (JP) .................................. 2017-234638

(51) Int. Cl.
*H01R 4/242* (2018.01)
*H01L 31/02* (2006.01)
(Continued)

(52) U.S. Cl.
CPC ....... *H01R 4/242* (2013.01); *H01L 31/02013* (2013.01); *H01R 4/70* (2013.01); *H01R 9/03* (2013.01); *H01R 25/00* (2013.01)

(58) Field of Classification Search
CPC .. H01R 4/2429; H01R 4/2433; H01R 9/0757; H01R 23/025
(Continued)

(56) References Cited

U.S. PATENT DOCUMENTS 8,033,859 B2 * 10/2011 Giefers .................. H01R 4/489
439/441
8,113,853 B2 * 2/2012 Coyle, Jr. ............... H02S 40/34
439/76.1
(Continued)

FOREIGN PATENT DOCUMENTS

CN 101606293 A 12/2009
CN 105313801 A 2/2016
(Continued)

OTHER PUBLICATIONS

Jun. 9, 2020, International Preliminary Report on Patentability issued in the International Patent Application No. PCT/JP2018/041212.

(Continued)

*Primary Examiner* — Phuong Chi Thi Nguyen
(74) *Attorney, Agent, or Firm* — Kenja IP Law PC

(57) ABSTRACT

A connection instrument includes: a cable including an electrical wire and two separated covering parts covering the electrical wire; a connection terminal connectable to a terminal of an external connector; a connection part; a flat plate-shaped wiring board; and a housing. The connection part electrically connects the connection terminal and the electrical wire exposed between the two separated covering parts. The connection terminal and connection part are arranged on the wiring board. The wiring board is located between the two covering parts. The housing allows insertion/extraction of the external connector and houses the wiring board. At least part of the wiring board is roughly in contact with or included in a space linking adjacent ends of the two covering parts.

10 Claims, 10 Drawing Sheets

(51) Int. Cl.
*H01R 4/70* (2006.01)
*H01R 9/03* (2006.01)
*H01R 25/00* (2006.01)

(58) Field of Classification Search
USPC ....... 439/395, 402, 405, 404, 403, 409, 418, 439/417
See application file for complete search history.

(56) References Cited

U.S. PATENT DOCUMENTS

| | | | |
|---|---|---|---|
| 8,197,263 B2* | 6/2012 | Rueggen | H02G 3/16 |
| | | | 439/76.1 |
| 8,632,358 B2* | 1/2014 | Leonhard | H01R 13/443 |
| | | | 439/528 |
| 9,028,262 B2* | 5/2015 | Deng | H01L 31/00 |
| | | | 439/76.1 |
| 9,660,406 B2* | 5/2017 | King, Jr. | H01R 13/5213 |
| 2010/0173511 A1 | 7/2010 | Giefers | |
| 2015/0349471 A1 | 12/2015 | Maki et al. | |
| 2020/0373686 A1* | 11/2020 | Yoshida | H01R 4/70 |

FOREIGN PATENT DOCUMENTS

| | | | |
|---|---|---|---|
| JP | 2004311217 A | 11/2004 | |
| JP | 5550748 B2 | 7/2014 | |
| JP | 2014157699 A | 8/2014 | |
| JP | 2015227088 A | 12/2015 | |
| JP | 2017212165 A | 11/2017 | |

OTHER PUBLICATIONS

Dec. 11, 2018, International Search Report issued in the International Patent Application No. PCT/JP2018/041212.

* cited by examiner

FIG. 3
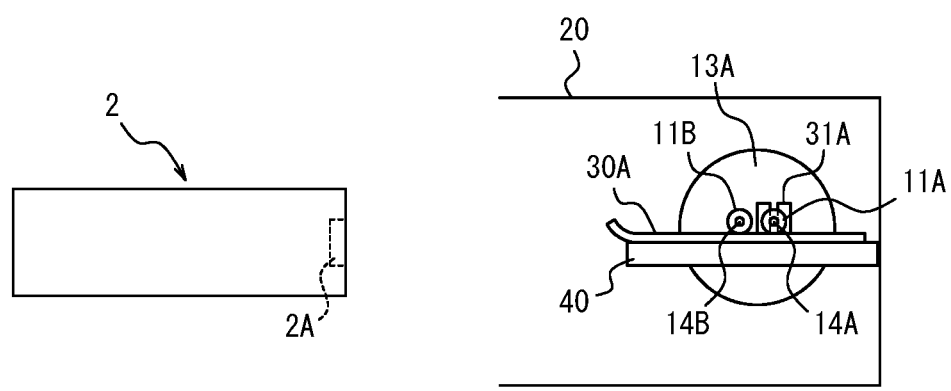
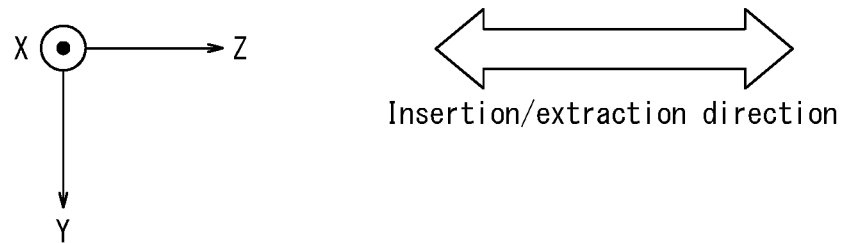
Insertion/extraction direction

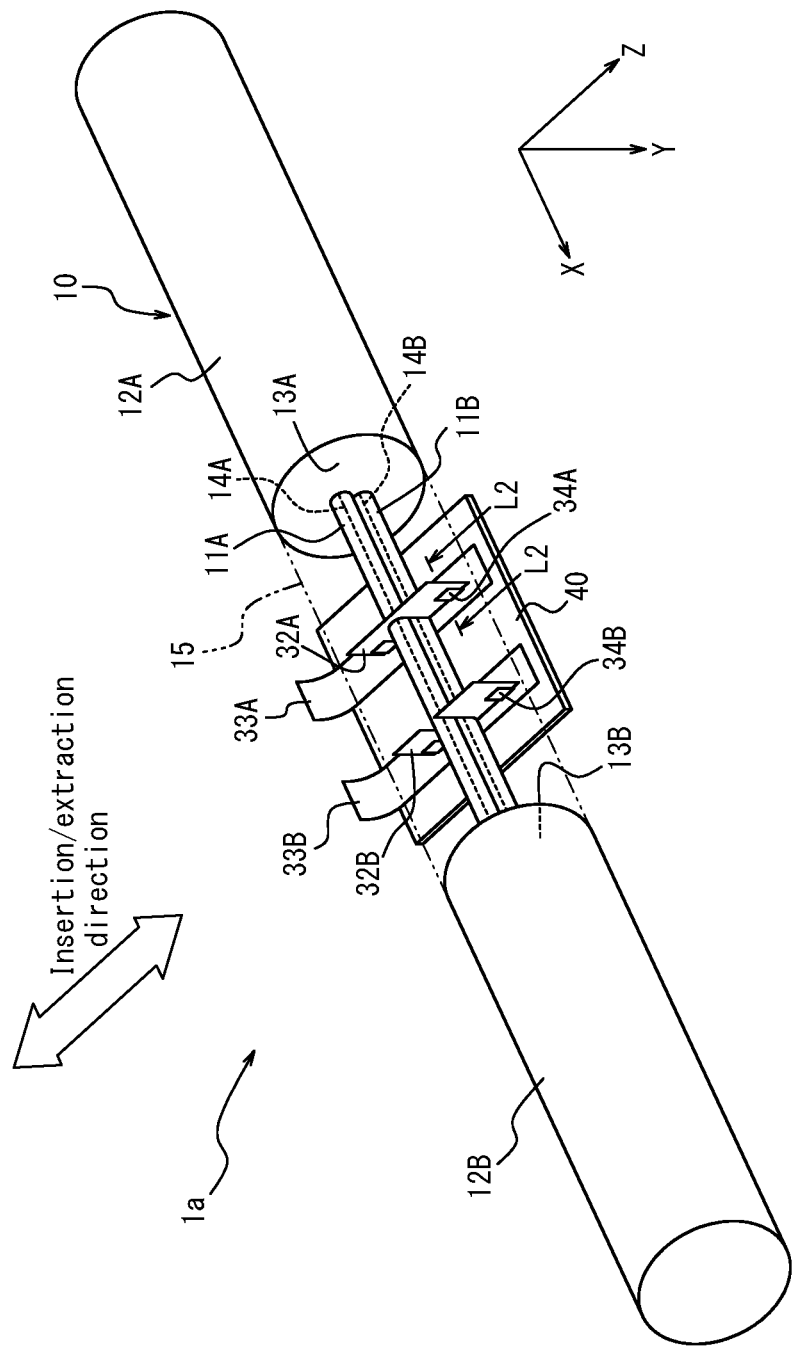

FIG. 7
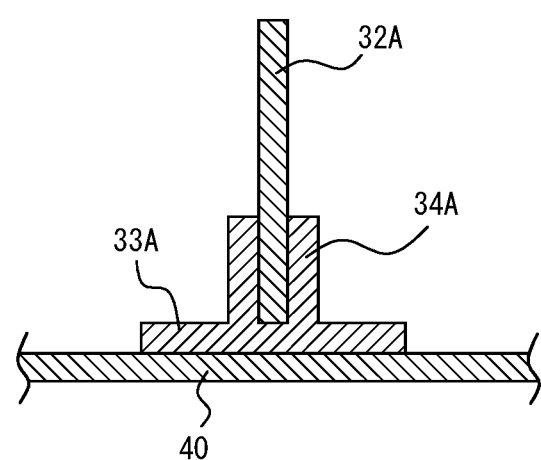
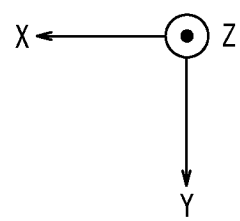

CONNECTION INSTRUMENT

TECHNICAL FIELD

The present disclosure relates to a connection instrument.

BACKGROUND

Connectors that electrically connect electrical devices to wiring are conventionally known (for example, Patent Literature (PTL) 1). By using such a connector to electrically connect an electrical device and wiring, it becomes possible for the electrical device to fulfill a desired function.

CITATION LIST

Patent Literature

PTL 1: JP 2004-311217 A

SUMMARY

Technical Problem

An insulation displacement connector described in PTL 1 includes a connector housing that is housed in an electrical device and an insulation displacement terminal that is connected to a core wire of wiring by insulation displacement. The wiring in PTL 1 is arranged outside of the connector housing. Moreover, the insulation displacement terminal in PTL 1 protrudes out of the connector housing in order to be connected to the core wire of the wiring that is arranged outside of the connector housing. Such a configuration may lead to an increase in the overall size of the insulation displacement connector described in PTL 1.

In addition, there is demand for improving the convenience of conventional connectors. For example, a user may want to confirm whether or not there is electrical continuity between an electrical device and wiring via a connector.

Accordingly, an objective of the present disclosure is to solve the problems set forth above and provide a connection instrument having improved convenience while also having reduced size.

Solution to Problem

The present disclosure aims to advantageously solve the problems set forth above by disclosing a connection instrument comprising: a cable that includes an electrical wire and two covering parts that cover the electrical wire and are separated from one another; a connection terminal that is connectable to a terminal of an external connector; a connection part that electrically connects the connection terminal and the electrical wire that is exposed between the two covering parts that are separated from one another; a wiring board that has a flat plate shape, that has the connection terminal and the connection part arranged thereon, and that is located between the two covering parts; and a housing that allows insertion and extraction of the external connector and that houses the wiring board, wherein at least part of the wiring board is roughly in contact with or included in a space that links respective ends of the two covering parts that are adjacent to one another. By adopting such a configuration, it is possible to prevent the housing from becoming large even though the wiring board on which the connection terminal and the like are arranged is housed therein, and thus it is possible to reduce the size of the connection instrument. Moreover, various electronic components can be arranged on the wiring board. By arranging various electronic components on the wiring board, convenience of the connection instrument can be improved.

In the presently disclosed connection instrument, it is preferable that a position of the connection part and a position of the terminal of the external connector roughly coincide in a direction perpendicular to an insertion/extraction direction in which the external connector is inserted and extracted when the external connector is inserted into and extracted from the housing. By adopting such a configuration, it is possible to prevent force from acting on the connection instrument in directions other than the insertion/extraction direction when the external connector is inserted into and extracted from the housing. This can prevent damage or the like of the connection instrument. Moreover, by adopting such a configuration, the position of the terminal of the external connector (i.e., a position of a part where the external connector and the housing fit together) roughly coincides with the position of the connection part (i.e., a position of the aforementioned space) in a direction perpendicular to the insertion/extraction direction. This makes it possible to reduce the thickness of the connection instrument.

In the presently disclosed connection instrument, it is preferable that the connection part is a metal piece formed on the connection terminal, the metal piece includes a notch, and the notch pinches a core wire of the electrical wire. By adopting a configuration in which the notch pinches the core wire in this manner, the reliability of electrical connection between the connection part and the core wire can be increased.

In the presently disclosed connection instrument, it is preferable that a longitudinal direction of the notch of the metal piece is roughly perpendicular to a longitudinal direction of the electrical wire. By adopting such a configuration, the direction in which the electrical wire is pressed into contact with the notch of the connection part and the longitudinal direction of the electrical wire can be roughly perpendicular to one another. This enables more reliable cutting of insulation of the electrical wire by the notch. Moreover, the notch of the connection part can more strongly pinch the core wire.

It is preferable that the presently disclosed connection instrument comprises: two of the electrical wire that are arranged in a thickness direction of the wiring board; two of the connection terminal; and two of the connection part, wherein one of the two connection parts is a metal piece including a notch that, from a side corresponding to the wiring board, pinches an electrical wire among the two electrical wires that is arranged at the side corresponding to the wiring board such that the notch pinches a core wire of the electrical wire, the other of the two connection parts is a metal piece including a notch that, from an opposite side to the wiring board, pinches an electrical wire among the two electrical wires that is arranged at the opposite side to the wiring board such that the notch pinches a core wire of the electrical wire, one of the two connection terminals is electrically connected to one of the two connection parts, and the other of the two connection terminals is electrically connected to the other of the two connection parts. By adopting such a configuration, the direction in which the notch of one of the connection parts pinches one of the core wires and the direction in which the notch of the other of the connection parts pinches the other of the core wires are opposing directions. This can further increase the reliability of electrical connection between one of the connection parts and one of the core wires, and also the reliability of electrical connection between the other of the connection parts and the other of the core wires.

In the presently disclosed connection instrument, it is preferable that the electrical wire is divided into two electrical wires, and the connection part includes: wiring that is electrically connected to the connection terminal; a member that electrically connects the wiring and one of the two electrical wires that are divided; and a member that electrically connects the wiring and the other of the two electrical wires that are divided. Such a configuration makes it possible to use a cable that is divided into two in the connection instrument. This can improve convenience of the connection instrument.

In the presently disclosed connection instrument, it is preferable that the electrical wire is arranged on the wiring board such that a longitudinal direction of the electrical wire is roughly parallel to an insertion/extraction direction in which the external connector is inserted and extracted. Such a configuration makes it possible for the longitudinal direction of the cable and the insertion/extraction direction to be roughly parallel. This enables an external device to be suspended roughly parallel to the cable and can increase the degree of freedom in arrangement of the external device on the cable.

It is preferable that the presently disclosed connection instrument further comprises an electronic component arranged on the wiring board, wherein the electronic component detects electrical continuity between the external connector and the cable. Such a configuration makes it possible to cause a light-emitting element to emit light, for example, when electrical continuity between the external connector and the cable is detected. A user is able to determine that there is electrical continuity between the external connector and the cable through visual confirmation of light emission by the light-emitting element.

It is preferable that the presently disclosed connection instrument further comprises an electronic component arranged on the wiring board, wherein the electronic component transmits and receives a prescribed signal via the cable. By adopting such a configuration, an external device attached to the external connector can communicate with another device via the cable.

In the presently disclosed connection instrument, it is preferable that the external connector is a connector that is attached to an energy harvester.

Advantageous Effect

According to the present disclosure, it is possible to provide a connection instrument having improved convenience while also having reduced size.

BRIEF DESCRIPTION OF THE DRAWINGS

In the accompanying drawings:

FIG. 3 is a cross-sectional view of the connection instrument along an L1-L1 line indicated in FIG. 1;

FIG. 6 illustrates schematic configuration of a connection instrument according to a second embodiment of the present disclosure;

FIG. 7 is a cross-sectional view of the connection instrument along an L2-L2 line indicated in FIG. 6;

DETAILED DESCRIPTION

The following provides a description of embodiments according to the present disclosure with reference to the drawings. Note that an insertion/extraction direction referred to in the present specification is a direction that is a combination of a positive Z-axis direction and a negative Z-axis direction illustrated in FIG. 1, etc.

First Embodiment

Figure 1:
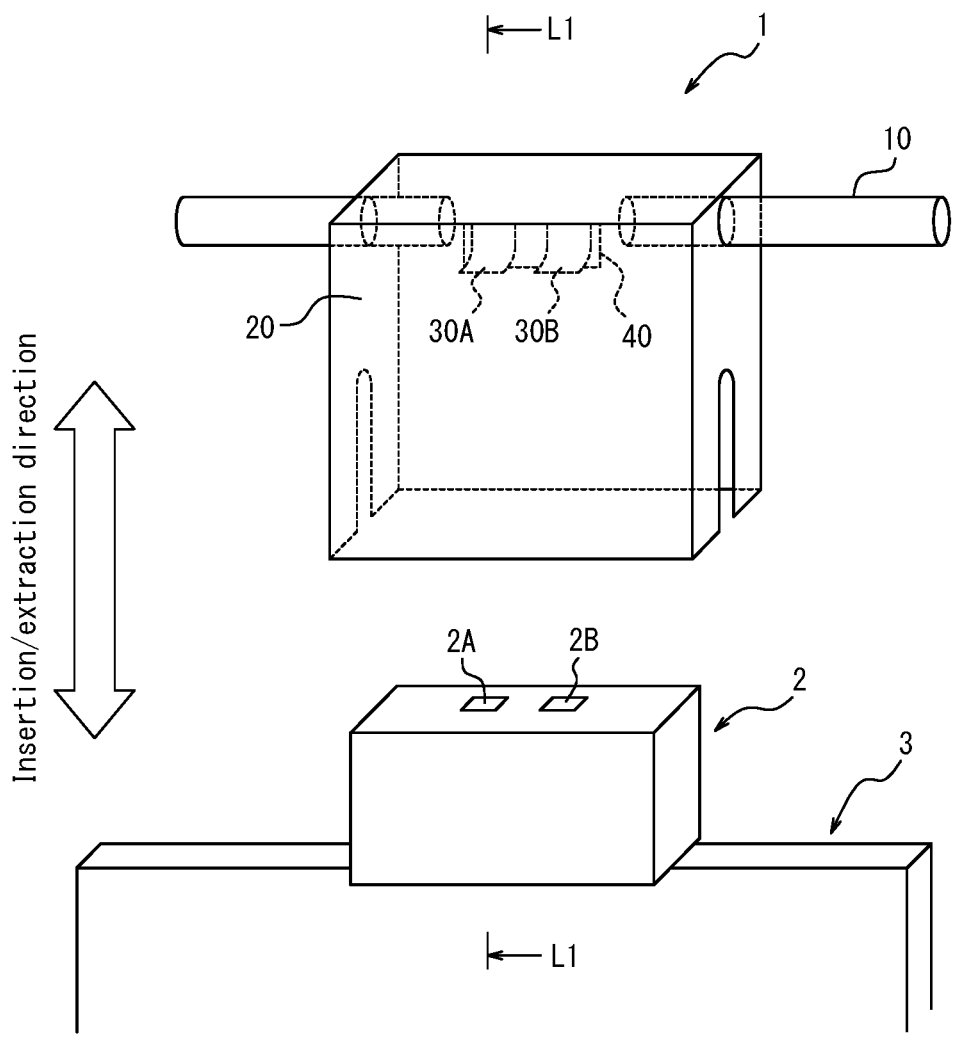
FIG. 1 illustrates schematic configuration of a connection instrument according to a first embodiment of the present disclosure.
Figure 2:
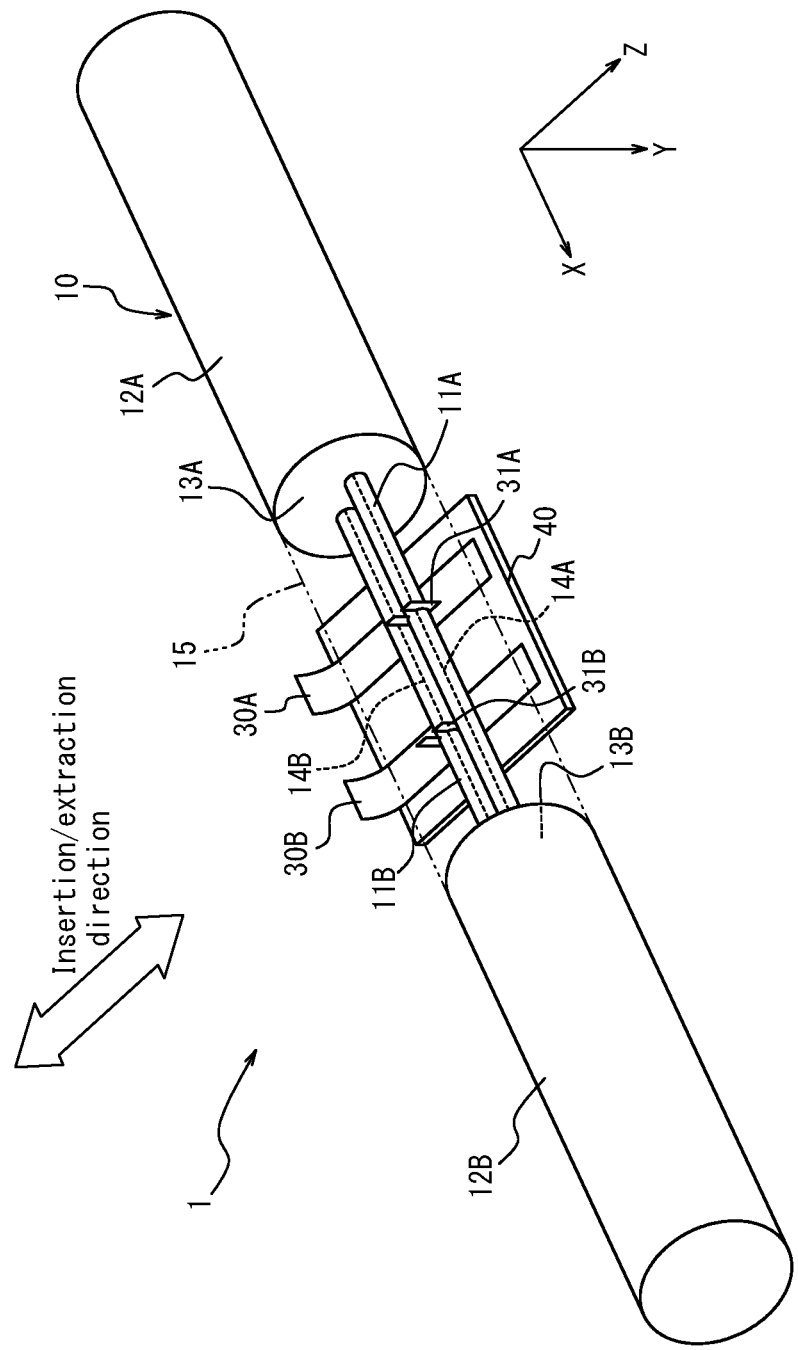
FIG. 2 illustrates a state in which a housing has been removed from the connection instrument illustrated in FIG. 1.

FIG. 1 illustrates schematic configuration of a connection instrument 1 according to a first embodiment of the present disclosure. FIG. 2 illustrates a state in which a housing 20 has been removed from the connection instrument 1 illustrated in FIG. 1. FIG. 3 is a cross-sectional view of the connection instrument 1 along an L1-L1 line indicated in FIG. 1.

The connection instrument 1 is mechanically and electrically connectable to an external connector 2. As illustrated in FIG. 1, the connection instrument 1 includes a cable 10 and a housing 20. Moreover, as illustrated in FIG. 2, the connection instrument 1 includes connection terminals 30A and 30B, connection parts 31A and 31B, and a wiring board 40 inside the housing 20.

Note that although the connection instrument 1 illustrated in FIG. 2 includes two connection terminals 30A and 30B, the number of connection terminals included in the connection instrument 1 is not limited to being two. The connection instrument 1 may include any number of connection terminals in accordance with the number of electrical wires included in the cable 10. Also note that although the connection instrument 1 illustrated in FIG. 2 includes two connection parts 31A and 31B, the number of connection parts included in the connection instrument 1 is not limited to being two. The connection instrument 1 may include any number of connection parts in accordance with the number of electrical wires included in the cable 10.

The external connector 2 is a male connector that is attached to an external device 3 as illustrated in FIG. 1. The external connector 2 includes a terminal 2A and a terminal 2B. The terminal 2A functions as a positive electrode terminal, for example. The terminal 2B functions as a negative electrode terminal, for example.

The external device 3 may be an energy harvester that generates electrical power in response to the external environment or may be a load device or the like, for example. Examples of the energy harvester referred to above include a thin solar cell panel including solar cells, a module that utilizes vibration to generate electricity, and a module that utilizes geothermal energy to generate electricity. Examples of the load device referred to above include a radio, lighting equipment, a speaker, a display instrument, an electric toy, and a secondary battery.

The cable 10 includes electrical wires 11A and 11B and two covering parts 12A and 12B as illustrated in FIG. 2. Note that although the cable 10 illustrated in FIG. 2 includes two electrical wires 11A and 11B, the number of electrical wires included in the cable 10 is not limited to being two. Alternatively, the cable 10 may include one electrical wire or may include three or more electrical wires.

The electrical wire 11A is an electrical wire of a positive electrode side, for example. The electrical wire 11B is an electrical wire of a negative electrode side, for example. The electrical wire 11A may include a core wire 14A that is electrically conductive and insulation that covers the core wire 14A. Likewise, the electrical wire 11B may include a core wire 14B that is electrically conductive and insulation that covers the core wire 14B.

A negative X-axis direction side of each of the electrical wires 11A and 11B is covered by the covering part 12A as illustrated in FIG. 2. A positive X-axis direction side of each of the electrical wires 11A and 11B is covered by the covering part 12B as illustrated in FIG. 2. Part of the electrical wire 11A is exposed from the covering parts 12A and 12B as illustrated in FIG. 2. The exposed part of the electrical wire 11A is electrically connected to the connection terminal 30A via the connection part 31A. Likewise, part of the electrical wire 11B is exposed from the covering parts 12A and 12B as illustrated in FIG. 2. The exposed part of the electrical wire 11B is electrically connected to the connection terminal 30B via the connection part 31B.

The covering parts 12A and 12B cover the electrical wires 11A and 11B as illustrated in FIG. 2. The covering parts 12A and 12B may be formed by an electrically insulating material. The covering part 12A has an end 13A. The covering part 12B has an end 13B. The end 13A and the end 13B are ends that are adjacent to one another. A space that links the end 13A and the end 13B is referred to as "space 15".

The covering part 12A and the covering part 12B are separated from one another as illustrated in FIG. 2. As a result of the covering part 12A and the covering part 12B being separated from one another, the electrical wires 11A and 11B are exposed between the covering part 12A and the covering part 12B.

The housing 20 houses the wiring board 40 as illustrated in FIG. 1. The housing 20 is a female connector. The housing 20 allows insertion and extraction of the external connector 2. The housing 20 fits with the external connector 2. Through fitting of the housing 20 with the external connector 2, the connection instrument 1 becomes mechanically connected to the external connector 2.

Note that in a case in which the external connector 2 is a female connector, for example, the housing 20 may be a male connector. Moreover, the shape of the housing 20 may be in accordance with the shape of the external connector 2. For example, in a case in which a protruding part is formed on a side wall of the external connector 2, a recessed part that fits with the protruding part may be formed in a side wall of the housing 20. Moreover, the shape of the housing 20 may be in accordance with the shape of the external device 3. For example, in a case in which the external device 3 is a thin solar cell panel, grooves into which the solar cell panel fits may be formed in both side walls of the housing 20 as illustrated in FIG. 1.

The housing 20 may have holes through which the cable 10 protrudes in both side walls as illustrated in FIG. 1. By adopting such a configuration, the housing 20 can be fitted with the external connector 2 while maintaining a state in which the cable 10 is taut along the X-axis direction. This makes it possible for the external device 3 to which the external connector 2 is attached to be placed in a state in which it is suspended toward the negative Z-axis direction side from the cable 10. In other words, a user can use the external device 3 in a state in which it is suspended from the cable 10. For example, in a case in which the external device 3 is a solar cell panel, a user can place the solar cell panel in a state in which it is suspended from the cable 10, and can cause the solar cell panel to generate electricity in this state. Moreover, in a case in which the external device 3 is a radio, for example, a user can place the radio in a state in which it is suspended from the cable 10, and can use the radio in this state.

The connection terminals 30A and 30B may be formed by an electrically conductive material. Examples of such electrically conductive materials include metal materials selected from the group consisting of copper, aluminum, nickel, and iron, and alloy materials containing any of these metal materials.

The connection terminal 30A functions as a positive electrode terminal, for example. The connection terminal 30B functions as a negative electrode terminal, for example. The connection terminals 30A and 30B are each arranged on the wiring board 40. The connection terminals 30A and 30B may each be fixed to the wiring board 40 by a fixing member. Examples of the fixing member referred to above include a jumper wire, a screw, and solder.

The connection terminal 30A is connectable to the terminal 2A of the external connector 2 illustrated in FIG. 1. The connection terminal 30B is connectable to the terminal 2B of the external connector 2 illustrated in FIG. 1. By connecting the connection terminal 30A to the terminal 2A of the external connector 2 and connecting the connection terminal 30B to the terminal 2B of the external connector 2, the connection instrument 1 becomes electrically connected to the external connector 2.

The tips of the connection terminals 30A and 30B may have a spring shape as illustrated in FIG. 2. By adopting such a configuration, it is possible to increase connection strength between the connection terminal 30A and the terminal 2A and connection strength between the connection terminal 30B and the terminal 2B. However, the shape of the tips of the connection terminals 30A and 30B is not limited to a spring shape. The shape may, for example, be that of a leaf spring or a coil spring.

The connection parts 31A and 31B may be formed by an electrically conductive material. Examples of such electrically conductive materials include metal materials selected from the group consisting of copper, aluminum, nickel, and iron, and alloy materials including any of these metal materials.

The connection part 31A electrically connects the connection terminal 30A and the electrical wire 11A that is exposed between the covering part 12A and the covering part 12B. The connection part 31B electrically connects the connection terminal 30B and the electrical wire 11B that is exposed between the covering part 12A and the covering part 12B.

The connection part 31A may be a metal piece, for example. The metal piece may include a notch that pinches the core wire 14A as illustrated in FIG. 3. By pinching the electrical wire 11A in the notch of the connection part 31A during a production process, for example, the insulation of the electrical wire 11A that covers the core wire 14A can be cut. Cutting of the insulation of the electrical wire 11A makes it possible for the notch of the metal piece to pinch the core wire 14A. Note that the connection part 31A and the connection terminal 30A may be formed as a unified body or may be formed as separate members. In a case in which the connection part 31A and the connection terminal 30A are formed as a unified body, the connection part 31A may be a metal piece formed on the connection terminal 30A. Moreover, in a case in which the connection part 31A and the connection terminal 30A are formed as separate members, the connection part 31A may be fixed to the connection terminal 30A by a fixing member. Alternatively, the connection part 31A and the connection terminal 30A may each be separately fixed to the wiring board 40. Examples of the fixing member referred to above include a jumper wire, a screw, and solder.

Likewise, the connection part 31B may be a metal piece, for example. The metal piece may include a notch that pinches the core wire 14B. In the same way as the connection part 31A and the connection terminal 30A, the connection part 31B and the connection terminal 30B may be formed as a unified body or may be formed as separate members.

By adopting a configuration in which the notch of the connection part 31A pinches the core wire 14A in this manner, the reliability of electrical connection between the connection part 31A and the core wire 14A can be increased. Likewise, by adopting a configuration in which the notch of the connection part 31B pinches the core wire 14B in this manner, the reliability of electrical connection between the connection part 31B and the core wire 14B can be increased.

A longitudinal direction of the notch of the connection part 31A may be roughly perpendicular to a longitudinal direction of the electrical wire 11A as illustrated in FIG. 2. By adopting such a configuration, the direction in which the electrical wire 11A is pressed into contact with the notch of the connection part 31A and the longitudinal direction of the electrical wire 11A can be roughly perpendicular to one another. This enables more reliable cutting of the insulation of the electrical wire 11A by the notch. Moreover, the notch of the connection part 31A can more strongly pinch the core wire 14A. Likewise, a longitudinal direction of the notch of the connection part 31B may be roughly perpendicular to a longitudinal direction of the electrical wire 11B.

Note that the connection parts 31A and 31B are not limited to being metal pieces. For example, the connection parts 31A and 31B may each be any member.

When the external connector 2 is inserted into and extracted from the housing 20, the position of the connection part 31A and the position of the terminal 2A of the external connector 2 may roughly coincide in a direction perpendicular to the insertion/extraction direction (i.e., in the Y-axis direction) as illustrated in FIG. 3. Likewise, when the external connector 2 is inserted into and extracted from the housing 20, the position of the connection part 31B and the position of the terminal 2B of the external connector 2 may roughly coincide in the Y-axis direction. By adopting such a configuration, it is possible to prevent force from acting on the connection instrument 1 in directions other than the insertion/extraction direction when the external connector 2 is inserted into and extracted from the housing 20. This can prevent damage or the like of the connection instrument 1. Moreover, by adopting such a configuration, the position of the terminal 2A of the external connector 2 (i.e., the position of a part where the external connector 2 and the housing 20 fit together) can roughly coincide with the position of the connection part 31A (i.e., the position of the space 15) in a direction perpendicular to the insertion/extraction direction. This makes it possible to reduce the thickness of the connection instrument 1.

The wiring board 40 illustrated in FIG. 2 is a printed circuit board (PCB), for example. The wiring board 40 has a flat plate shape, for example. Various wiring may be formed in the wiring board 40. Moreover, various electronic components may be arranged on the wiring board 40.

The wiring board 40 is located between the covering part 12A and the covering part 12B. The wiring board 40 has the connection terminals 30A and 30B and the connection parts 31A and 31B arranged thereon. At least part of the wiring board 40 is roughly in contact with the space 15 or is included in the space 15. In the present embodiment, at least part of the wiring board 40 is included in the space 15 as illustrated in FIGS. 2 and 3.

Thus, in the connection instrument 1 according to the first embodiment, the connection terminals 30A and 30B and the connection parts 31A and 31B are arranged on the wiring board 40 housed in the housing 20. Moreover, at least part of the wiring board 40 is roughly in contact with the space 15 or is included in the space 15. By adopting such a configuration, it is possible to prevent the housing 20 from becoming large even though the wiring board 40 on which the connection terminal 30A and the like are arranged is housed in the housing 20, and thus it is possible to reduce the size of the connection instrument 1.

Moreover, various electronic components can be arranged on the wiring board 40 in the first embodiment. The following describes an example of electronic components arranged on the wiring board 40. By arranging electronic components on the wiring board 40 as described below, it is possible to improve the convenience of the connection instrument 1 in the present embodiment.

Figure 4:
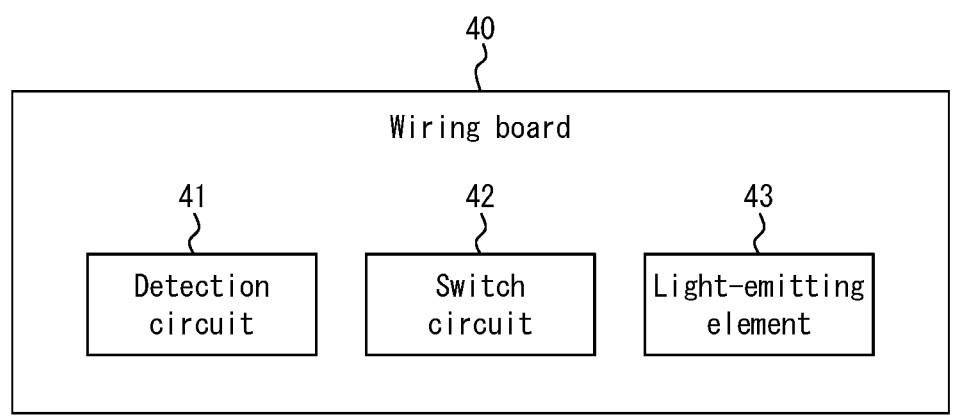
FIG. 4 is an example of a functional block diagram of a wiring board according to the first embodiment of the present disclosure.

FIG. 4 is an example of a functional block diagram of the wiring board 40 according to the first embodiment of the present disclosure. The wiring board 40 has a detection circuit 41 as an electronic component. In addition, the wiring board 40 may have a switch circuit 42 and a light-emitting element 43 as electronic components.

The detection circuit 41 detects electrical continuity between the external connector 2 and the cable 10 illustrated in FIG. 1. The detection circuit 41 may be electrically connected to the external connector 2 and the cable 10. The detection circuit 41 may include one or more of a transistor, a resistive element, and a capacitive element, for example.

The switch circuit 42 is in an ON state or an OFF state based on a detection result of the detection circuit 41. The switch circuit 42 may include one or more of a transistor, a resistive element, and a capacitive element, for example.

In a case in which the external device 3 illustrated in FIG. 1 is an energy harvester, for example, the switch circuit 42 is arranged between the external device 3 and the light-emitting element 43. In this case, the switch circuit 42 may be in an ON state for a prescribed time, for example, when the detection circuit 41 detects electrical continuity between the external connector 2 and the cable 10 illustrated in FIG. 1. When the switch circuit 42 is in an ON state, the switch circuit 42 electrically connects the external device 3 and the light-emitting element 43. When this occurs, the light-emitting element 43 emits light for a prescribed time, for example, through electrical power from the external device 3 (energy harvester). A user is able to determine that there is electrical continuity between the cable 10 and the external device 3 to which the external connector 2 is attached through visual confirmation of light emission by the light-emitting element 43.

In a case in which the external device 3 illustrated in FIG. 1 is a load device, for example, the switch circuit 42 is arranged between the cable 10 and the light-emitting element 43. In this case, the switch circuit 42 is in an ON state for a prescribed time, for example, when the detection circuit 41 detects electrical continuity between the external connector 2 and the cable 10 illustrated in FIG. 1. When the switch circuit 42 is in an ON state, the switch circuit 42 electrically connects the cable 10 and the light-emitting element 43. When this occurs, the light-emitting element 43 emits light for a prescribed time, for example, through electrical power from the cable 10. A user is able to determine that there is electrical continuity between the external connector 2 and the cable 10 through visual confirmation of light emission by the light-emitting element 43.

The light-emitting element 43 may include an LED. Part of the light-emitting element 43 may be exposed from the housing 20 illustrated in FIG. 1. The light-emitting element 43 can emit light through electrical power from the cable 10 or electrical power from the external device 3.

Figure 5A:
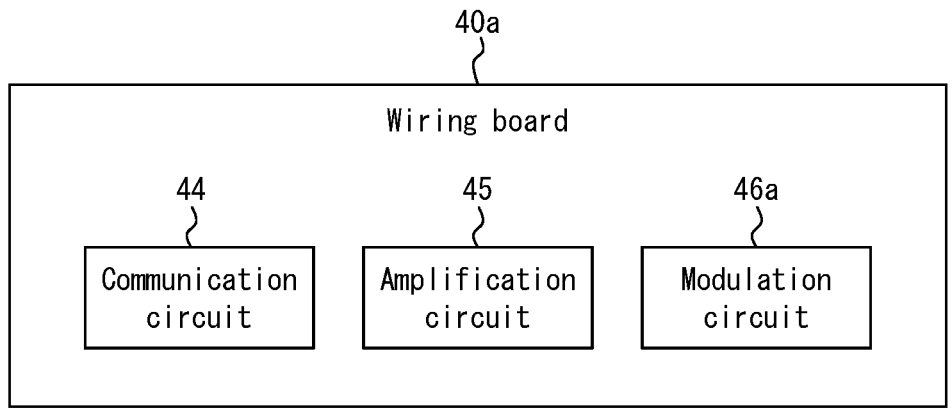
FIG. 5A is another example of a functional block diagram of a wiring board according to the first embodiment of the present disclosure (other example 1)
Figure 5B:
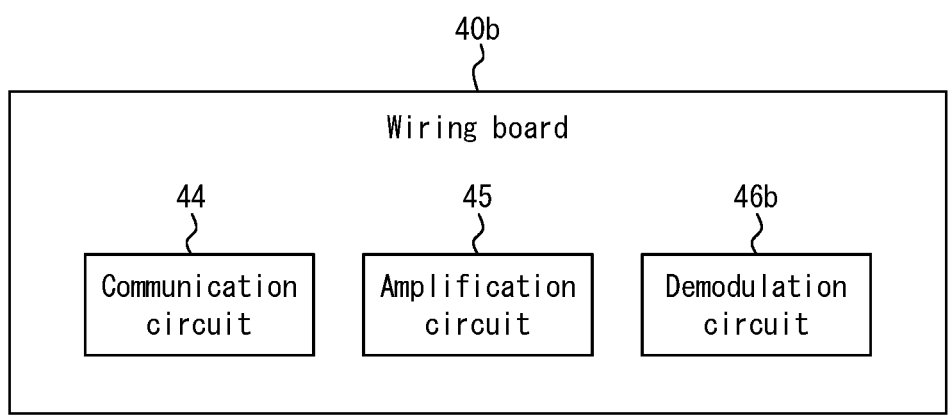
FIG. 5B is another example of a functional block diagram of a wiring board according to the first embodiment of the present disclosure (other example 2)
Figure 5C:
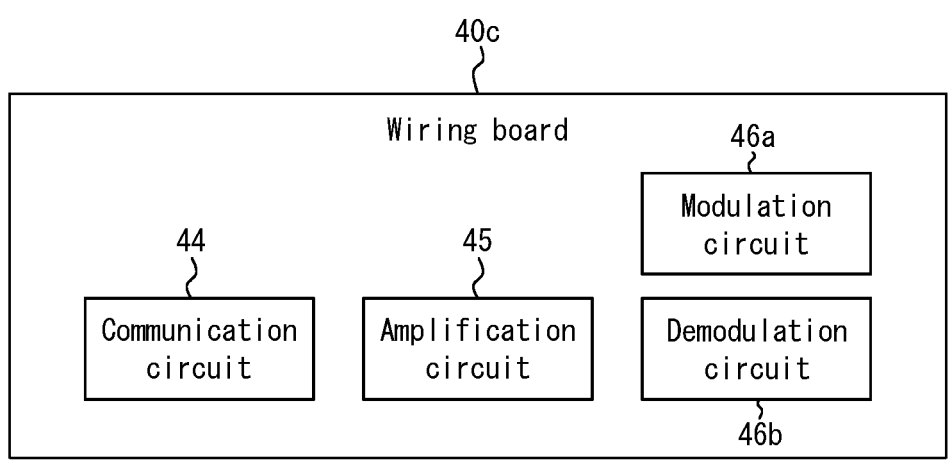
FIG. 5C is another example of a functional block diagram of a wiring board according to the first embodiment of the present disclosure (other example 3)

FIG. 5A is another example of a functional block diagram of a wiring board 40a according to the first embodiment of the present disclosure (other example 1). FIG. 5B is another example of a functional block diagram of a wiring board 40b according to the first embodiment of the present disclosure (other example 2). FIG. 5C is another example of a functional block diagram of a wiring board 40c according to the first embodiment of the present disclosure (other example 3).

As illustrated in FIGS. 5A to 5C, the wiring board 40a, the wiring board 40b, and the wiring board 40c each have a communication circuit 44 as an electronic component. The wiring board 40a may further have an amplification circuit 45 and a modulation circuit 46a as electronic components as illustrated in FIG. 5A. Moreover, the wiring board 40b may further have an amplification circuit 45 and a demodulation circuit 46b as electronic components as illustrated in FIG. 5B. Furthermore, the wiring board 40c may further have an amplification circuit 45, a modulation circuit 46a, and a demodulation circuit 46b as illustrated in FIG. 5C. The communication circuit 44, the amplification circuit 45, the modulation circuit 46a, and the demodulation circuit 46b may operate through electrical power from the cable 10. Alternatively, in a case in which the external device 3 is an energy harvester, for example, the communication circuit 44, the amplification circuit 45, the modulation circuit 46a, and the demodulation circuit 46b may operate through electrical power from the energy harvester.

The communication circuit 44 executes transmission and reception of a prescribed signal via the cable 10 illustrated in FIG. 1. Moreover, the communication circuit 44 executes transmission and reception of a prescribed signal with respect to the external connector 2 illustrated in FIG. 1. The communication circuit 44 may include one or more of a transistor, a resistive element, and a capacitive element, for example.

The amplification circuit 45 amplifies a prescribed signal before the prescribed signal is transmitted to the cable 10 or the external connector 2 by the communication circuit 44. Moreover, the amplification circuit 45 amplifies a prescribed signal received by the communication circuit 44 from the cable 10 or the external connector 2. The amplification circuit 45 may include one or more of a transistor, a resistive element, and a capacitive element, for example.

The modulation circuit 46a modulates the frequency or phase of a prescribed signal in accordance with a prescribed modulation method. The modulation circuit 46a may include one or more of a transistor, a resistive element, and a capacitive element, for example.

The demodulation circuit 46b demodulates the frequency or phase of a prescribed signal in accordance with a prescribed demodulation method. The demodulation circuit 46b may include one or more of a transistor, a resistive element, and a capacitive element, for example.

Such processing enables the external device 3 to communicate with another device via the cable 10. Thus, when the external device 3 is connected to the connection instrument 1 via the external connector 2, it is possible for identification information of the external device 3 to be transmitted to the other device via the cable 10, for example. It is also possible for the other device to transmit a control command to the external device 3 via the cable 10, for example.

Second Embodiment

The following describes a connection instrument 1a according to a second embodiment of the present disclosure. The following description focuses on differences between the connection instrument 1a according to the second embodiment and the connection instrument 1 according to the first embodiment.

FIG. 6 illustrates schematic configuration of the connection instrument 1a according to the second embodiment of the present disclosure. FIG. 7 is a cross-sectional view of the connection instrument 1a along an L2-L2 line indicated in FIG. 6. Note that elements of configuration illustrated in FIG. 6 that are the same as elements of configuration illustrated in FIG. 2 are marked by the same reference signs and description thereof is omitted. FIG. 6 illustrates the connection instrument 1a in a state in which a housing 20 has been removed in the same manner as in FIG. 2.

The connection instrument 1a includes a cable 10, connection parts 32A and 32B, connection terminals 33A and 33B, and a wiring board 40 as illustrated in FIG. 6.

The cable 10 includes electrical wires 11A and 11B as illustrated in FIG. 6. The electrical wires 11A and 11B are arranged in a thickness direction of the wiring board 40 (i.e., a Y-axis direction).

The connection part 32A is a metal piece that includes a notch as illustrated in FIG. 6. The notch of the connection part 32A pinches, from an opposite side to the wiring board 40 (i.e., a negative Y-axis direction side), the electrical wire 11A that, among the electrical wires 11A and 11B, is arranged at the opposite side to the wiring board 40 (i.e., the negative Y-axis direction side). As a result of the notch of the connection part 32A pinching the electrical wire 11A, the notch of the connection part 32A is electrically connected to a core wire of the electrical wire 11A. More specifically, as a result of the notch of the connection part 32A pinching the electrical wire 11A, insulation covering the core wire of the electrical wire 11A is cut, and the notch can be electrically connected to the core wire of the electrical wire 11A.

The connection part 32B is a metal piece that includes a notch as illustrated in FIG. 6. The notch of the connection part 32B pinches, from a side corresponding to the wiring board 40 (i.e., a positive Y-axis direction side), the electrical wire 11B that, among the electrical wires 11A and 11B, is arranged at the side corresponding to the wiring board 40 (i.e., the positive Y-axis direction side). As a result of the notch of the connection part 32B pinching the electrical wire 11B, the notch of the connection part 32B is electrically connected to a core wire of the electrical wire 11B. More specifically, as a result of the notch of the connection part 32B pinching the electrical wire 11B, insulation covering the core wire of the electrical wire 11B is cut, and the notch can be electrically connected to the core wire of the electrical wire 11B.

The connection terminal 33A functions as a positive electrode terminal, for example. The connection terminal 33A is connectable to the terminal 2A of the external connector 2 illustrated in FIG. 1. The connection terminal 33B functions as a negative electrode terminal, for example. The connection terminal 33B is connectable to the terminal 2B of the external connector 2 illustrated in FIG. 1.

The connection terminal 33A is electrically connected to the connection part 32A. The connection terminal 33A has a holding part 34A formed thereon, for example. The holding part 34A holds the connection part 32A as illustrated in FIG. 7. As a result of the holding part 34A holding the connection part 32A, the connection terminal 33A is electrically connected to the connection part 32A.

The connection terminal 33B is electrically connected to the connection part 32B. The connection terminal 33B has a holding part 34B formed thereon, for example. The holding part 34B holds the connection part 32B in the same manner as the holding part 34A illustrated in FIG. 7. As a result of the holding part 34B holding the connection part 32B, the connection terminal 33B is electrically connected to the connection part 32B.

Thus, in the connection instrument 1a according to the second embodiment, the electrical wires 11A and 11B are arranged in the thickness direction of the wiring board 40 (i.e., the Y-axis direction). Moreover, the notch of the connection part 32A pinches the core wire 14A arranged at the negative Y-axis direction side from the negative Y-axis direction side, whereas the notch of the connection part 32B pinches the core wire 14B arranged at the positive Y-axis direction side from the positive Y-axis direction side. By adopting such a configuration, the direction in which the notch of the connection part 32A pinches the core wire 14A and the direction in which the notch of the connection part 32B pinches the core wire 14B are opposing directions. This can further increase the reliability of electrical connection between the connection part 32A and the core wire 14A, and also the reliability of electrical connection between the connection part 32B and the core wire 14B.

Other effects and configurations of the connection instrument 1a according to the second embodiment are the same as for the connection instrument 1 according to the first embodiment.

Third Embodiment

The following describes a connection instrument 1b according to a third embodiment of the present disclosure. The following description focuses on differences between the connection instrument 1b according to the third embodiment and the connection instrument 1 according to the first embodiment.

Figure 8:
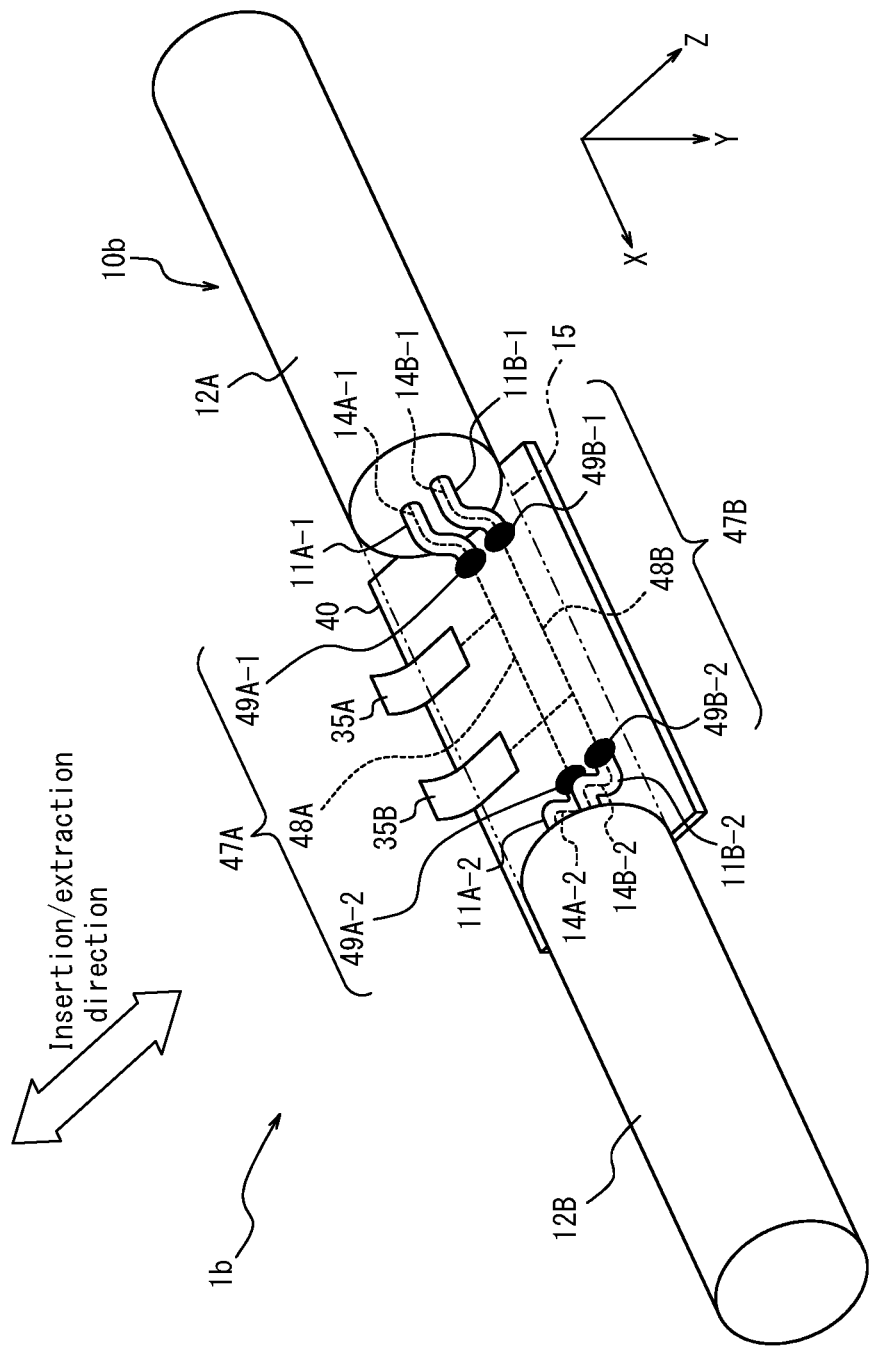
FIG. 8 illustrates schematic configuration of a connection instrument according to a third embodiment of the present disclosure.

FIG. 8 illustrates schematic configuration of the connection instrument 1b according to the third embodiment of the present disclosure. Note that elements of configuration illustrated in FIG. 8 that are the same as elements of configuration illustrated in FIG. 2 are marked by the same reference signs and description thereof is omitted. FIG. 8 illustrates the connection instrument 1b in a state in which a housing 20 has been removed in the same manner as in FIG. 2.

The connection instrument 1b includes a cable 10b, connection terminals 35A and 35B, a wiring board 40, and connection parts 47A and 47B as illustrated in FIG. 8.

An electrical wire 11A is divided into two. In other words, the electrical wire 11A includes an electrical wire 11A-1 and an electrical wire 11A-2 that are divided from one another. The electrical wire 11A-1 may include a core wire 14A-1 that is electrically conductive and insulation that covers the core wire 14A-1. The electrical wire 11A-2 may include a core wire 14A-2 that is electrically conductive and insulation that covers the core wire 14A-2.

Likewise, an electrical wire 11B is divided into two. In other words, the electrical wire 11B includes an electrical wire 11B-1 and an electrical wire 11B-2 that are divided from one another. The electrical wire 11B-1 may include a core wire 14B-1 that is electrically conductive and insulation that covers the core wire 14B-1. The electrical wire 11B-2 may include a core wire 14B-2 that is electrically conductive and insulation that covers the core wire 14B-2.

The connection terminal 35A functions as a positive electrode terminal, for example. The connection terminal 35A is connectable to the terminal 2A of the external connector 2 illustrated in FIG. 1. The connection terminal 35B functions as a negative electrode terminal, for example. The connection terminal 35B is connectable to the terminal 2B of the external connector 2 illustrated in FIG. 1.

The connection part 47A includes wiring 48A and members 49A-1 and 49A-2. The connection part 47B includes wiring 48B and members 49B-1 and 49B-2.

The wiring 48A is electrically connected to the connection terminal 35A. The wiring 48B is electrically connected to the connection terminal 35B. The wiring 48A and 48B may each be formed on the wiring board 40.

The member 49A-1 electrically connects the electrical wire 11A-1 and the wiring 48A. The member 49A-2 electrically connects the electrical wire 11A-2 and the wiring 48A. The members 49A-1 and 49A-2 may each include solder and a via.

The member 49B-1 electrically connects the electrical wire 11B-1 and the wiring 48B. The member 49B-2 electrically connects the electrical wire 11B-2 and the wiring 48B. The members 49B-1 and 49B-2 may each include solder and a via.

Thus, in the connection instrument 1b according to the third embodiment, the electrical wires 11A-1 and 11A-2 that are divided and the connection terminal 35A are electrically connected through the connection part 47A. Moreover, the two electrical wires 11B-1 and 11B-2 that are divided and the connection terminal 35B are electrically connected through the connection part 47B. Such a configuration makes it possible to use the cable 10b that is divided into two in the connection instrument 1b. This can improve convenience of the connection instrument 1b. For example, the length of the cable 10 included in the connection instrument 1b can be adjusted as appropriate.

Other effects and configurations of the connection instrument 1b according to the third embodiment are the same as for the connection instrument 1 according to the first embodiment.

Fourth Embodiment

The following describes a connection instrument 1c according to a fourth embodiment of the present disclosure.

The following description focuses on differences between the connection instrument 1c according to the fourth embodiment and the connection instrument 1 according to the first embodiment.

Figure 9:
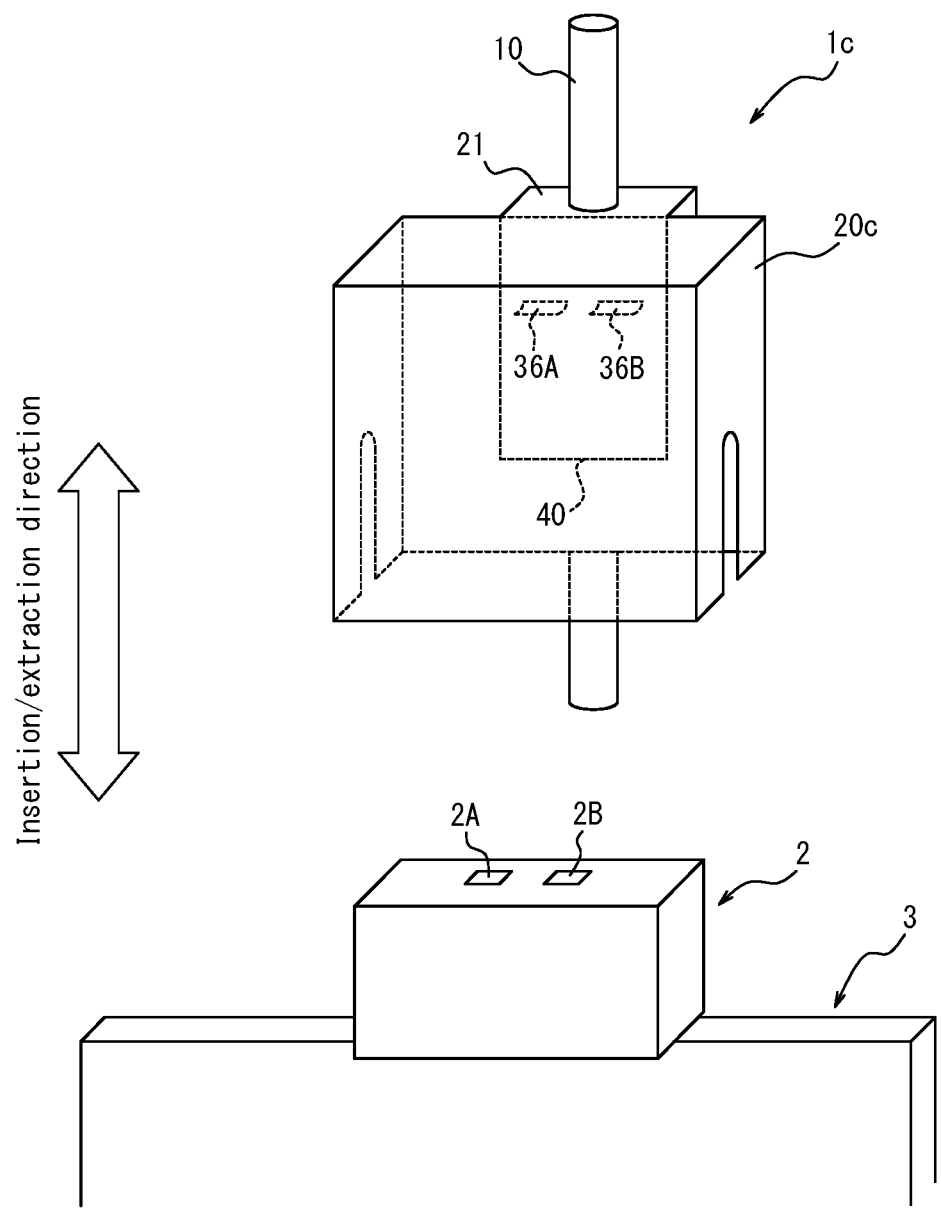
FIG. 9 illustrates schematic configuration of a connection instrument according to a fourth embodiment of the present disclosure.
Figure 10:
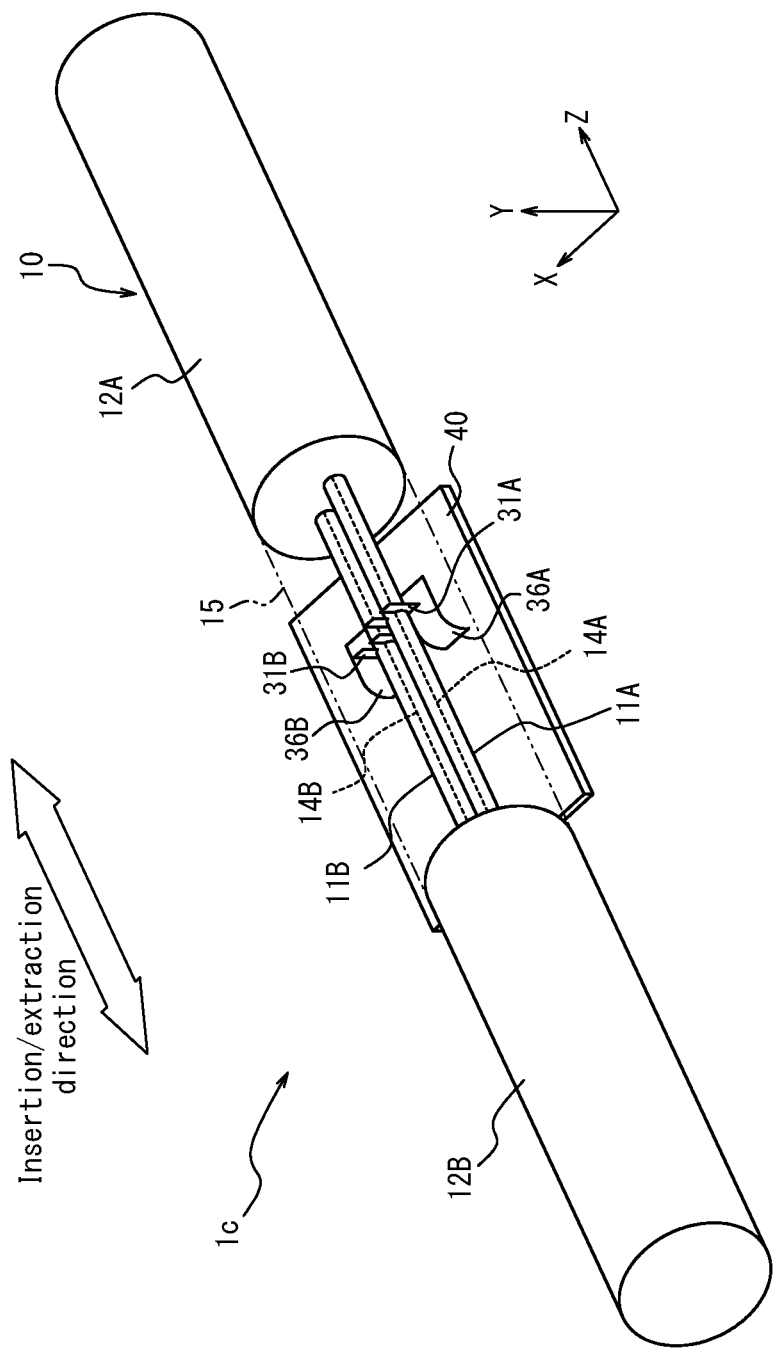
FIG. 10 illustrates a state in which a housing has been removed from the connection instrument illustrated in FIG. 9.

FIG. 9 illustrates schematic configuration of the connection instrument 1c according to the fourth embodiment of the present disclosure. FIG. 10 illustrates a state in which a housing 20c has been removed from the connection instrument illustrated in FIG. 9. Note that elements of configuration illustrated in FIG. 9 that are the same as elements of configuration illustrated in FIG. 1 are marked by the same reference signs and description thereof is omitted. Moreover, elements of configuration illustrated in FIG. 10 that are the same as elements of configuration illustrated in FIG. 2 are marked by the same reference signs and description thereof is omitted.

As illustrated in FIG. 9, the connection instrument 1c includes a cable 10 and a housing 20c. The connection instrument 1c also includes connection parts 31A and 31B, connection terminals 36A and 36B, and a wiring board 40 inside the housing 20c.

An electrical wire 11A is arranged on the wiring board 40 such that a longitudinal direction of the electrical wire 11A is roughly parallel to the insertion/extraction direction (i.e., the Z-axis direction) as illustrated in FIG. 10. Likewise, an electrical wire 11B is arranged on the wiring board 40 such that a longitudinal direction of the electrical wire 11B is roughly parallel to the insertion/extraction direction (i.e., the Z-axis direction) as illustrated in FIG. 10.

The housing 20c allows insertion and extraction of an external connector 2. The housing 20c fits with the external connector 2. Through fitting of the housing 20c with the external connector 2, the connection instrument 1c becomes mechanically connected to the external connector 2.

The housing 20c includes a protruding part 21 formed on a side surface at a positive Y-axis direction side thereof. The protruding part 21 of the housing 20c houses the wiring board 40. The protruding part 21 includes holes through which the cable 10 protrudes in an upper surface and a lower surface as illustrated in FIG. 9.

The connection terminal 36A functions as a positive electrode terminal, for example. The connection terminal 36B functions as a negative electrode terminal, for example.

Part of the connection terminal 36A is arranged on a surface at the positive Y-axis direction side of the wiring board 40 as illustrated in FIG. 10. This part of the connection terminal 36A is electrically connected to an electrical wire 11A through the connection part 31A. Likewise, part of the connection terminal 36B is arranged on a surface at the positive Y-axis direction side of the wiring board 40 as illustrated in FIG. 10. This part of the connection terminal 36B is electrically connected to an electrical wire 11B through the connection part 31B.

Respective tips of the connection terminals 36A and 36B each protrude from a surface at a negative Y-axis direction side of the wiring board 40 as illustrated in FIG. 10. The tip of the connection terminal 36A is electrically connectable to a terminal 2A of the external connector 2 illustrated in FIG. 9. The tip of the connection terminal 36B is electrically connectable to a terminal 2B of the external connector 2 illustrated in FIG. 9.

The tips of the connection terminals 36A and 36B may have a spring shape as illustrated in FIG. 10. However, the shape of the tips of the connection terminals 36A and 36B is not limited to a spring shape. The shape may, for example, be that of a leaf spring or a coil spring.

Thus, in the connection instrument 1c according to the fourth embodiment, the electrical wires 11A and 11B are each arranged on the wiring board 40 such that the longitudinal direction of the electrical wires 11A and 11B is roughly parallel to the insertion/extraction direction. Such a configuration makes it possible for the longitudinal direction of the cable 10 and the insertion/extraction direction to be roughly parallel in the fourth embodiment. This enables an external device 3 to be suspended roughly parallel to the cable 10 and can increase the degree of freedom in arrangement of the external device 3 on the cable 10.

Other effects and configurations of the connection instrument 1c according to the fourth embodiment are the same as for the connection instrument 1 according to the first embodiment.

The preceding description only illustrates some embodiments of the present disclosure and it goes without saying that various alterations may be made within the scope of the claims.

INDUSTRIAL APPLICABILITY

According to the present disclosure, it is possible to provide a connection instrument that has improved convenience while also having reduced size.

REFERENCE SIGNS LIST 1, 1a, 1b, 1c connection instrument
2 external connector
2A, 2B terminal
3 external device
10, 10b cable
11A, 11A-1, 11A-2, 11B, 11B-1, 11B-2 electrical wire
12A, 12B covering part
13A, 13B end
14A, 14A-1, 14A-2, 14B, 14B-1, 14B-2 core wire
15 space
20, 20c housing
21 protruding part
30A, 30B, 33A, 33B, 35A, 35B, 36A, 36B connection terminal
31A, 31B, 32A, 32B, 47A, 47B connection part
34A, 34B holding part
40, 40a, 40b, 40c wiring board
41 detection circuit
42 switch circuit
43 light-emitting element
44 communication circuit
45 amplification circuit
46a modulation circuit
46b demodulation circuit
48A, 48B wiring
49A-1, 49A-2, 49B-1, 49B-2 member

The invention claimed is:
1. A connection instrument comprising:
a cable that includes an electrical wire and two covering parts that cover the electrical wire and are separated from one another;
a connection terminal that is connectable to a terminal of an external connector;
a connection part that electrically connects the connection terminal and the electrical wire that is exposed between the two covering parts that are separated from one another;

a wiring board that has a flat plate shape, that has the connection terminal and the connection part arranged thereon, and that is located between the two covering parts; and a housing that allows insertion and extraction of the external connector and that houses the wiring board, wherein at least part of the wiring board is roughly in contact with or included in a space that links respective ends of the two covering parts that are adjacent to one another.

2. The connection instrument according to claim 1, wherein a position of the connection part and a position of the terminal of the external connector roughly coincide in a direction perpendicular to an insertion/extraction direction in which the external connector is inserted and extracted when the external connector is inserted into and extracted from the housing.

3. The connection instrument according to claim 1, comprising: two of the electrical wire that are arranged in a thickness direction of the wiring board; two of the connection terminal; and two of the connection part, wherein one of the two connection parts is a metal piece including a notch that, from a side corresponding to the wiring board, pinches an electrical wire among the two electrical wires that is arranged at the side corresponding to the wiring board such that the notch pinches a core wire of the electrical wire, the other of the two connection parts is a metal piece including a notch that, from an opposite side to the wiring board, pinches an electrical wire among the two electrical wires that is arranged at the opposite side to the wiring board such that the notch pinches a core wire of the electrical wire, and one of the two connection terminals is electrically connected to one of the two connection parts, and the other of the two connection terminals is electrically connected to the other of the two connection parts.

4. The connection instrument according to claim 1, wherein the electrical wire is divided into two electrical wires, and the connection part includes: wiring that is electrically connected to the connection terminal; a member that electrically connects the wiring and one of the two electrical wires that are divided; and a member that electrically connects the wiring and the other of the two electrical wires that are divided.

5. The connection instrument according to claim 1, wherein the electrical wire is arranged on the wiring board such that a longitudinal direction of the electrical wire is roughly parallel to an insertion/extraction direction in which the external connector is inserted and extracted.

6. The connection instrument according to claim 1, further comprising an electrical component arranged on the wiring board, wherein the electrical component detects electrical continuity between the external connector and the cable.

7. The connection instrument according to claim 1, further comprising an electrical component arranged on the wiring board, wherein the electrical component transmits and receives a prescribed signal via the cable.

8. The connection instrument according to claim 1, wherein the external connector is a connector that is attached to an energy harvester.

9. The connection instrument according to claim 1, wherein the connection part is a metal piece formed on the connection terminal, the metal piece includes a notch, and the notch pinches a core wire of the electrical wire.

10. The connection instrument according to claim 9, wherein a longitudinal direction of the notch of the metal piece is roughly perpendicular to a longitudinal direction of the electrical wire.

* * * * *